(12) United States Patent
Zhao et al.

(10) Patent No.: US 9,857,989 B1
(45) Date of Patent: Jan. 2, 2018

(54) SOLID STATE MEMORY COMPONENT

(71) Applicant: Intel Corporation, Santa Clara, CA (US)

(72) Inventors: Jun Zhao, Boise, ID (US); Gowrisankar Damarla, Boise, ID (US); David A. Daycock, Boise, ID (US); Gordon A. Haller, Boise, ID (US); Sri Sai Sivakumar Vegunta, Boise, ID (US); John B. Matovu, Boise, ID (US); Matthew R. Park, Boise, ID (US); Prakash Rau Mokhna Rau, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/283,296

(22) Filed: Oct. 1, 2016

(51) Int. Cl.
  *G11C 16/06* (2006.01)
  *G06F 3/06* (2006.01)

(52) U.S. Cl.
  CPC ............ *G06F 3/061* (2013.01); *G06F 3/0655* (2013.01); *G06F 3/0688* (2013.01)

(58) Field of Classification Search
  CPC ....... G06F 3/061; G06F 3/0655; G06F 3/0688
  See application file for complete search history.

(56) References Cited

U.S. PATENT DOCUMENTS

| 2010/0038703 A1* | 2/2010 | Fukuzumi | G11C 5/02 257/326 |
| 2016/0260722 A1* | 9/2016 | Baba | H01L 27/11582 |
| 2017/0077120 A1* | 3/2017 | Sawabe | H01L 27/11582 |
| 2017/0194326 A1* | 7/2017 | Kim | H01L 23/5283 |

* cited by examiner

*Primary Examiner* — Pho M Luu
(74) *Attorney, Agent, or Firm* — Thorpe North & Western, LLP; David W. Osborne

(57) ABSTRACT

A solid state memory component can include a plurality of bit lines, a source line, and a plurality of non-functional memory pillars. Each non-functional memory pillar is electrically isolated from one or both of the plurality of bit lines and the source line. A solid state memory component can also include a plurality of pillars located in a periphery portion of the solid state memory component, and memory cells adjacent to each of the pillars. Associated systems and methods can include or otherwise utilize such solid state memory components.

16 Claims, 10 Drawing Sheets

SOLID STATE MEMORY COMPONENT

TECHNICAL FIELD

Embodiments described herein relate generally to computer memory, and more particularly to solid state memory devices.

BACKGROUND

A NAND flash memory device is a common type of flash memory device, so called for the logical form in which the basic memory cell configuration is arranged. Typically, an array of memory cells for NAND flash memory is arranged such that a control gate of each memory cell in a row of the array is connected to form an access line, such as a word line. Columns of the array include strings (often termed NAND strings) of memory cells connected together in series, source to drain, between a pair of select lines, a source select line and a drain select line.

A "column" refers to a group of memory cells that are commonly coupled to a local data line, such as a local bit line. It does not require any particular orientation or linear relationship, but instead refers to the logical relationship between memory cell and data line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

One way of increasing the density of memory devices is to form stacked memory arrays, e.g., often referred to as three-dimensional (3D) memory arrays. For example, one type of three-dimensional memory array may include pillars of stacked memory elements, such as substantially vertical NAND strings.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein.

Figure 1:
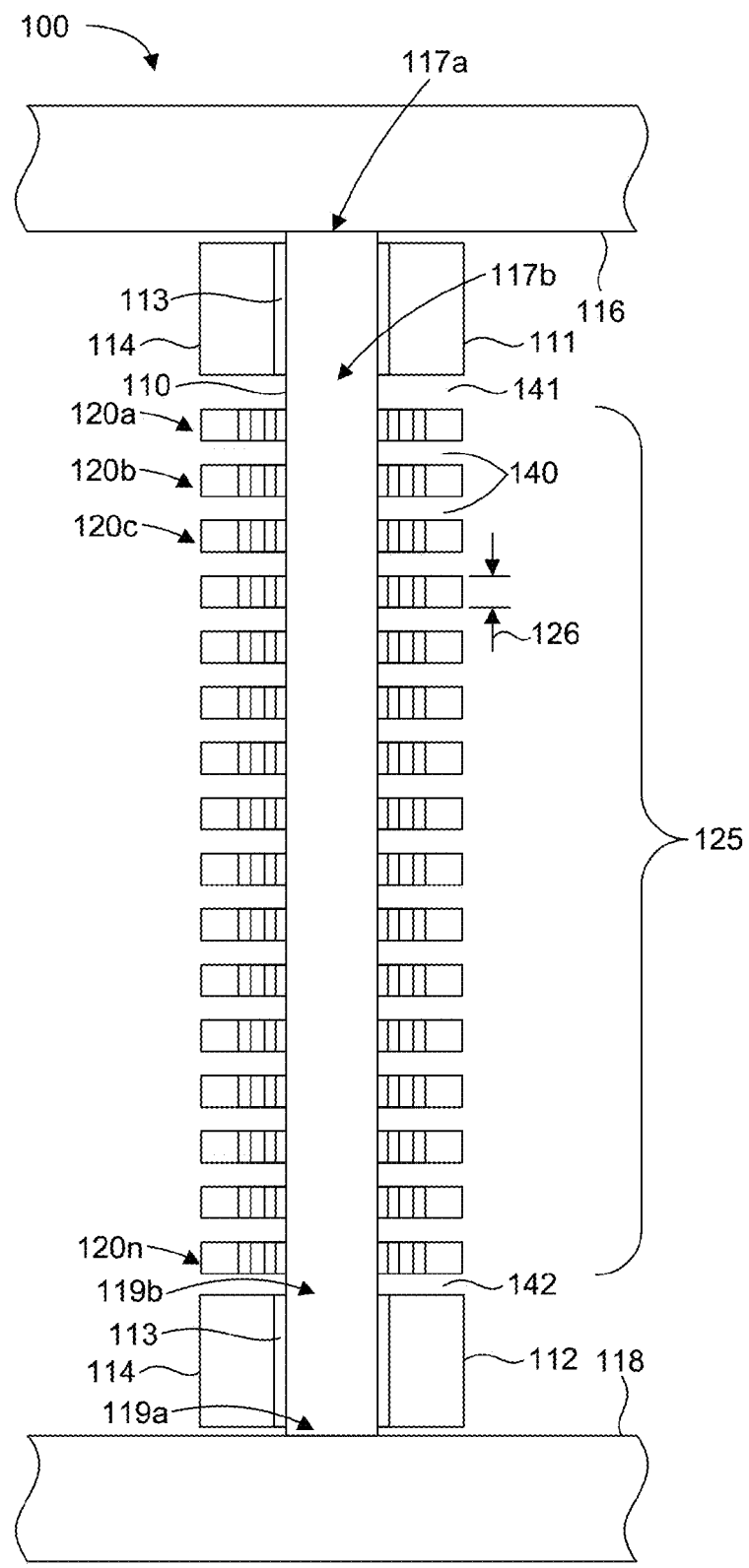
FIG. 1 illustrates a portion of a solid state memory component in accordance with an example.

Reference will now be made to the exemplary embodiments illustrated, and specific language will be used herein to describe the same. It will nevertheless be understood that no limitation of the disclosure scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" include express support for plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law.

"Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description, like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. Objects described herein as being "adjacent to" each other may be in physical contact with each other, in close proximity to each other, or in the same general region or area as each other, as appropriate for the context in which the phrase is used.

As used herein, comparative terms such as "increased," "decreased," "better," "worse," "higher," "lower," "enhanced," "maximized," and "minimized," and the like refer to a property of a device, component, or activity that is measurably different from other comparable devices, components, or activities, or from different iterations or embodiments of the same device, properties in the known state of the art. For example, a data region that has an "increased" risk of corruption can refer to a region of a memory device, which is more likely to have write errors to it than other regions in the same memory device. A number of factors can cause such increased risk, including location, fabrication process, number of program pulses applied to the region, etc.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment. Occurrences of the phrase "in one embodiment," or "in one aspect," herein do not necessarily all refer to the same embodiment or aspect.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

EXAMPLE EMBODIMENTS

An initial overview of technology embodiments is provided below and specific technology embodiments are then described in further detail. This initial summary is intended to aid readers in understanding the technology more quickly, but is not intended to identify key or essential features of the technology nor is it intended to limit the scope of the claimed subject matter.

Certain processes in the manufacture of NAND flash memory devices can be susceptible to non-uniformity and misalignment resulting from the formation of memory cell structures in a memory array. Such misalignment can result in significantly lowered performance and reliability. Accordingly, solid state memory components are disclosed which minimize or eliminate non-uniformity and misalignment during manufacture.

One exemplary mechanism by which such misalignment issues can be minimized or eliminated is by inclusion of non-functional memory structures in the memory component. In one aspect, memory structures are included in a periphery region outside the memory array to provide such benefits. In one example, a solid state memory component can include a plurality of bit lines, a source line, and a plurality of non-functional memory pillars. Each non-functional memory pillar is electrically isolated from one or both of the plurality of bit lines and the source line. In another example, a solid state memory component can include a plurality of pillars located in a periphery portion of the solid state memory component, and memory cells adjacent to each of the pillars. Associated systems and methods are also disclosed.

Referring to FIG. 1, a portion of a solid state memory component 100 is illustrated. In general, the portion of the solid state memory component includes a memory pillar 110 and memory cells 120a-n (i.e., a string 125 of memory cells, such as a NAND string) located adjacent to the memory pillar 110. Any suitable number of memory cells can be included. The memory pillar 110 can act as a channel region for the memory cells 120a-n, which can be coupled in series. For example, during operation of one or more of the memory cells 120a-n of the string, a channel can be formed in the memory pillar 110. The memory pillar 110 and the string of memory cells 120a-n can be oriented vertically, such as in a three-dimensional memory array. For example, memory cell 120a is located at a vertical level (e.g., near the top of the memory array) that is above a vertical level (e.g., near the bottom of the memory array) at which memory cell 120n is located. The memory cells 120a-n can have any suitable structure. A memory cell structure is provided for context and by way of an example. Therefore, it should be recognized that suitable memory cell structures can vary from the memory cell structure disclosed herein.

Figure 2:
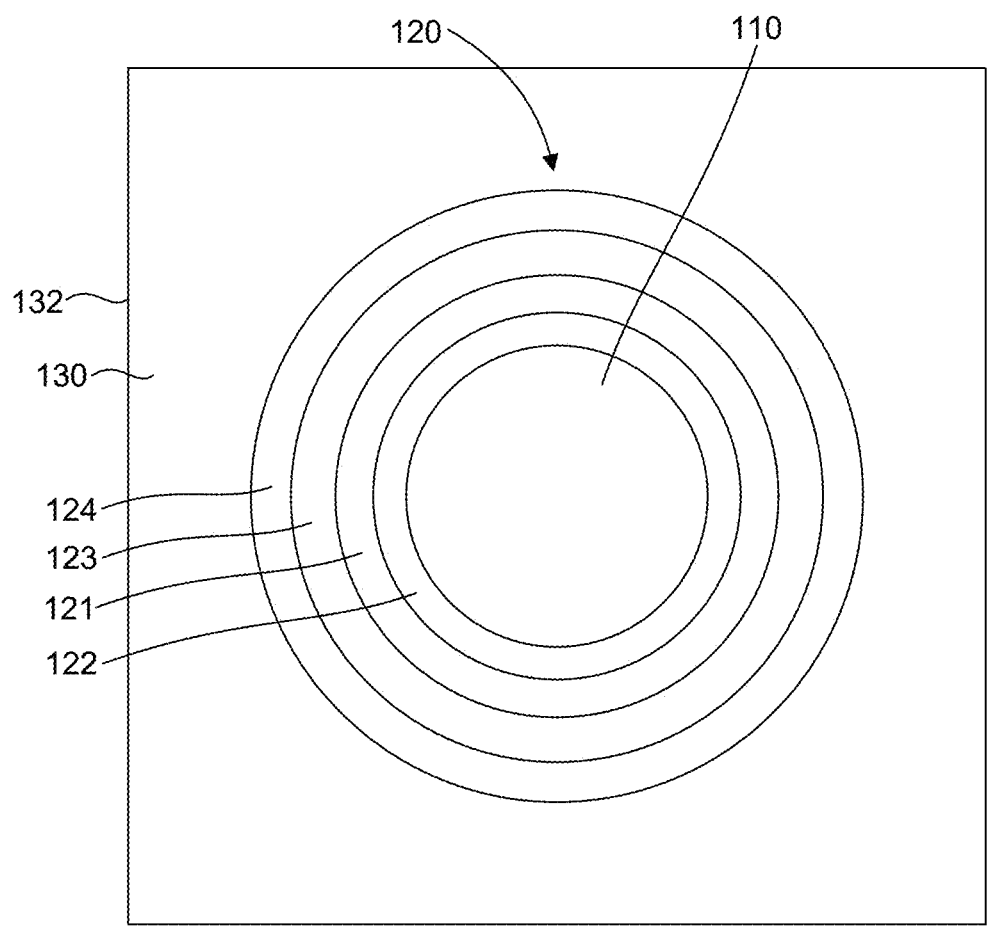
FIG. 2 illustrates a top view of a memory pillar and a memory cell of the solid state memory component of FIG. 1.
Figure 3:
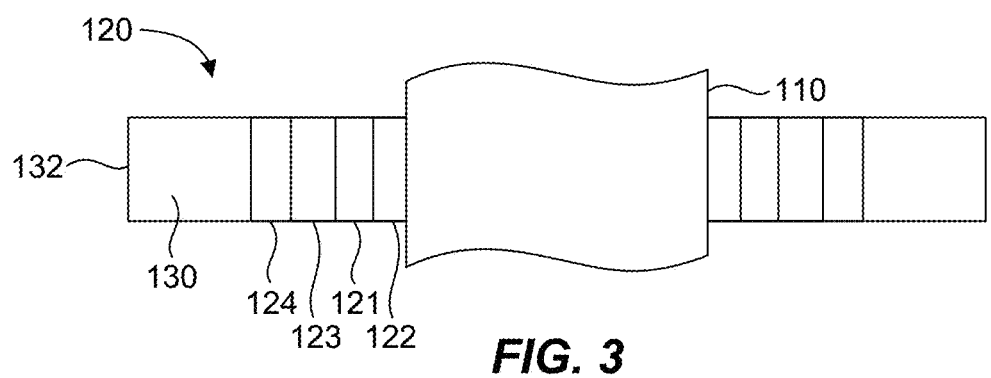
FIG. 3 illustrates a side view of a memory pillar and a memory cell of the solid state memory component of FIG. 1.

Each memory cell 120a-n in this example can have a charge-storage structure (e.g., that may be a conductive floating gate, a dielectric charge trap, etc.). For example, as shown in FIGS. 2 and 3, which illustrate top and side views, respectively, of the memory pillar 120 and a representative memory cell 120, the memory cell 120 can have a charge-storage structure 121. Each memory cell 120a-n can also have a tunnel dielectric interposed between its charge-storage structure and the pillar 110. For example, the memory cell 120 can have a tunnel dielectric 113 interposed between the charge-storage structure 121 and the pillar 110. In addition, each memory cell 120a-n can have a control gate (e.g., as a portion of or coupled to access lines, such as word lines). For example, the memory cell 120 can include a control gate 130. Each memory cell can have one or more dielectric materials or dielectric layers interposed between its charge-storage structure and the control gate. For example, the memory cell 120 can include dielectric layers 123 and 124 interposed between the charge-storage structure 121 and the control gate 130.

Each memory cell 120 may be a non-volatile memory cell and may have a charge-storage structure 121, such as a floating gate that may be a conductor (e.g., polysilicon), a charge trap that may be a dielectric, etc. Non-limiting examples of dielectrics that are suitable for charge traps include nitrides, high-dielectric constant (high-K) dielectrics, such as alumina ($Al_2O_3$) having a K of about 10, with embedded conductive particles (e.g., nano-dots), such as embedded metal particles or embedded nano-crystals (e.g., silicon, germanium, or metal crystals), a silicon rich dielectric, or $SiON/Si_3N_4$.

With further reference to FIG. 1, a dielectric 140 may be interposed between successively adjacent memory cells 120a-n in the string 125. For example, a dielectric 140 may be interposed between at least the floating gates 121, the dielectrics 123, 124, and the control gates 130 of successively adjacent memory cells 120a-n. A dielectric 141 may be interposed between an end (e.g., between memory cell 120a) of the string 125 and the select gate 111, and a dielectric 142 may be interposed between an opposite end (e.g., between memory cell 120n) of the string 125 and the select gate 112, as shown in FIG. 1.

In some embodiments, where the charge-storage structure 121 is a charge trap, the tunnel dielectric 122, the charge-storage structure 121, and the dielectrics 123, 124 can form a continuous structure that can be shared by (e.g., that may be common to) two or more of the memory cells 120a-n. For example, such a structure can be shared by or common to all of the memory cells 120a-n.

Each of the memory cells 120a-n can have a thickness (e.g., a channel length) 126. For example, the memory cells 120a-n can have the same channel length regardless of where in string 125 the memory cells are located. In some embodiments, at least one channel length of a memory cell can be different from another channel length of another memory cell.

In some embodiments, the string 125 can be interposed between and coupled in series to "dummy" memory cells (not shown) to form a string of memory cells that includes the string 125 and "dummy" memory cells. For example, one or more "dummy" memory cells can be interposed between and coupled in series with the memory cell 120a of the string 125 and the select gate 111, and/or one or more "dummy" memory cells can be interposed between and coupled in series with the memory cell 120n of the string 125 and the select gate 112. Each "dummy" memory cell can be configured in a manner similar to, and may have the same components as, the memory cells 120a-n.

Each memory cell 120a-n of the string 125 can be coupled in series with and can be between a select gate (e.g., a drain select gate) 111 adjacent to (e.g., in contact with) the pillar 110 and a select gate (e.g., a source select gate) 112 adjacent to (e.g., in contact with) the pillar 110. For a functional memory pillar, the pillar 110 is electrically coupled to a data line (e.g., a bit line 116), indicated at 117. Thus, the select gate 111 can selectively couple the string 125 to the data line (e.g., the bit line 116). In addition, for a functional memory pillar, the pillar 110 is electrically coupled to a source line 118, indicated at 119. Thus, the select gate 112 can selectively couple the string 125 to the source line 118. For example, the select gate 111 can be coupled in series with memory cell 120a, and the select gate 112 can be coupled in series with memory cell 120n. The select gates 111 and 112 can each include a gate dielectric 113 adjacent to (e.g., in contact with) pillar 110 and a control gate 114 adjacent to (e.g., in contact with) a corresponding gate dielectric 113.

In contrast, a non-functional or "dummy" memory pillar is electrically isolated from the data line or bit line 116 and/or electrically isolated from the source line 118. In other words, a non-functional memory pillar is not electrically coupled to the data line or bit line 116 at 117a and/or 117b, and/or is not electrically coupled to the source line 118 at 119a and/or 119b. Thus, in some embodiments, a non-functional memory pillar can have some or all of the characteristics of a functional memory pillar described above (e.g., same construction, same materials, and proximity to memory cells), but differs in the lack of an electrical connection to the data or bit line 116 and/or the lack of an electrical connection to the source line 118. Non-functional pillars can be of any suitable size. In one aspect, non-functional pillars can be sized different that functional pillars. In another aspect, non-functional pillars can be sized the same, or about the same as that of functional pillars.

Figure 4:
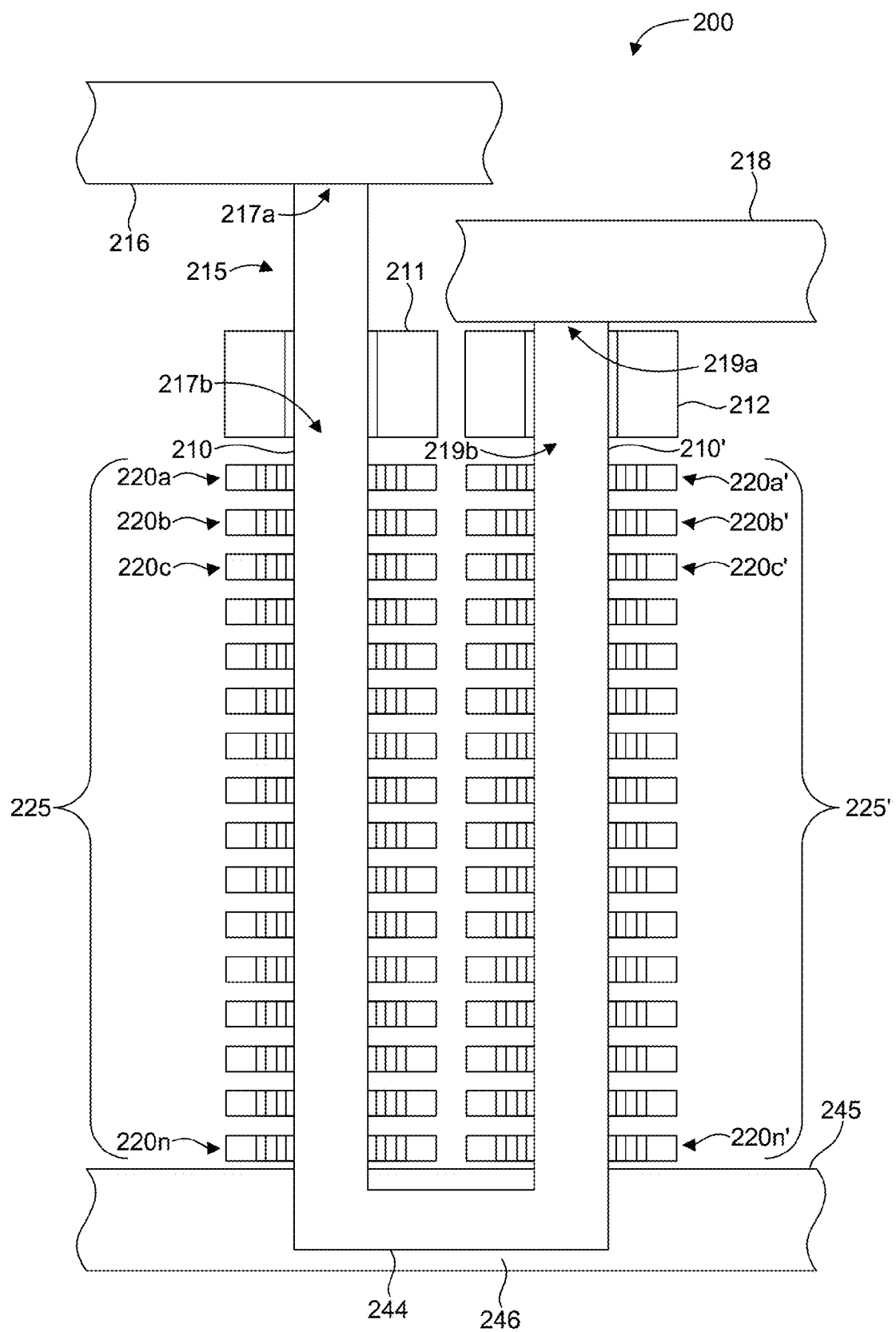
FIG. 4 illustrates a portion of a solid state memory component in accordance with another example.

FIG. 4 illustrates a portion of a computer memory component 200 in accordance with another example. In this case, strings 225 and 225' of memory cells 220a-n and 220a'-n' may be respectively adjacent to (e.g., in contact with) pillars 210 and 210'. As shown in the figure, the pillars 210, 210' can be located laterally of each other or side by side. Each of the strings 225 and 225' may include memory cells coupled in series.

A semiconductor segment 244, which can be of the same material as the pillars 210, 210', can physically couple the pillar 210 to the pillar 210' to form a semiconductor structure 215 that includes the pillars 210 and 210'. The semiconductor segment 244 can be substantially horizontal, in contrast to the pillars 210, 210', which can be substantially vertical. The semiconductor segment 244 can be a conductor 245 that can generally be formed of one or more conductive materials, such as conductively doped polysilicon. The semiconductor segment 244 can electrically couple the string 225 in series with the string 225' upon applying an appropriate bias to conductor 245. For example, semiconductor segment 244 and conductor 245 can form a connector gate 246 that selectively couples string the 225 in series with the string 225'. The selectively coupled strings 225 and 225' can form portions of a single string of memory cells (e.g., the memory cells 220a-n of the string 225 and the memory cells 220a'-n' of the string 225').

Such a string of memory cells can be between and coupled in series with select gates 211 and 212. For example, each memory cell 220a-n, 220a'-n' can be coupled in series with and can be between the select gate 211 and the select gate 212. For functional memory pillars, the pillars 210, 210' are electrically coupled to a data line (e.g., a bit line 216), indicated at 217. Thus, the select gate 211 may selectively couple the strings 225, 225' to the bit line 216. In addition, for functional memory pillars, the pillars 210, 210' are electrically coupled to a source line 218, indicated at 219. Thus, the select gate 212 can selectively couple the strings 225, 225' to the source line 218. Note, that each memory cell 220a-n of the string 225 can be between and coupled in series with the select gate 211 and the connector gate 246, and that each memory cell 220a'-n' of the string 225' can be between and coupled in series with the connector gate 246 and the select gate 212.

In contrast, non-functional or "dummy" memory pillars are electrically isolated from the data line or bit line 216 and/or electrically isolated from the source line 218. In other words, non-functional memory pillars are not electrically coupled to either the data line, or bit line, or both the data line and bit line 216 at 217a and/or 217b, and/or are not electrically coupled to the source line 218 at 219a and/or 219b. Thus, in some embodiments, non-functional memory pillars can have some or all of the characteristics of functional memory pillars described above (e.g., same construction, same materials, and proximity to memory cells), but differ in the lack of an electrical connection to the data or bit line 216 and/or the lack of an electrical connection to the source line 218.

Typical solid state memory components do not include non-functional memory pillars alone or in combination with associated memory cell features. In one aspect, the technology of the present disclosure provides for the inclusion of non-functional memory pillars and associated memory cell features in a solid state memory component. It should be recognized that a typical solid state memory component in accordance with the present disclosure can include many non-functional pillars, functional memory pillars and associated memory cells, bit lines, etc., which are illustrated in FIGS. 1 and 4.

Figure 5A:
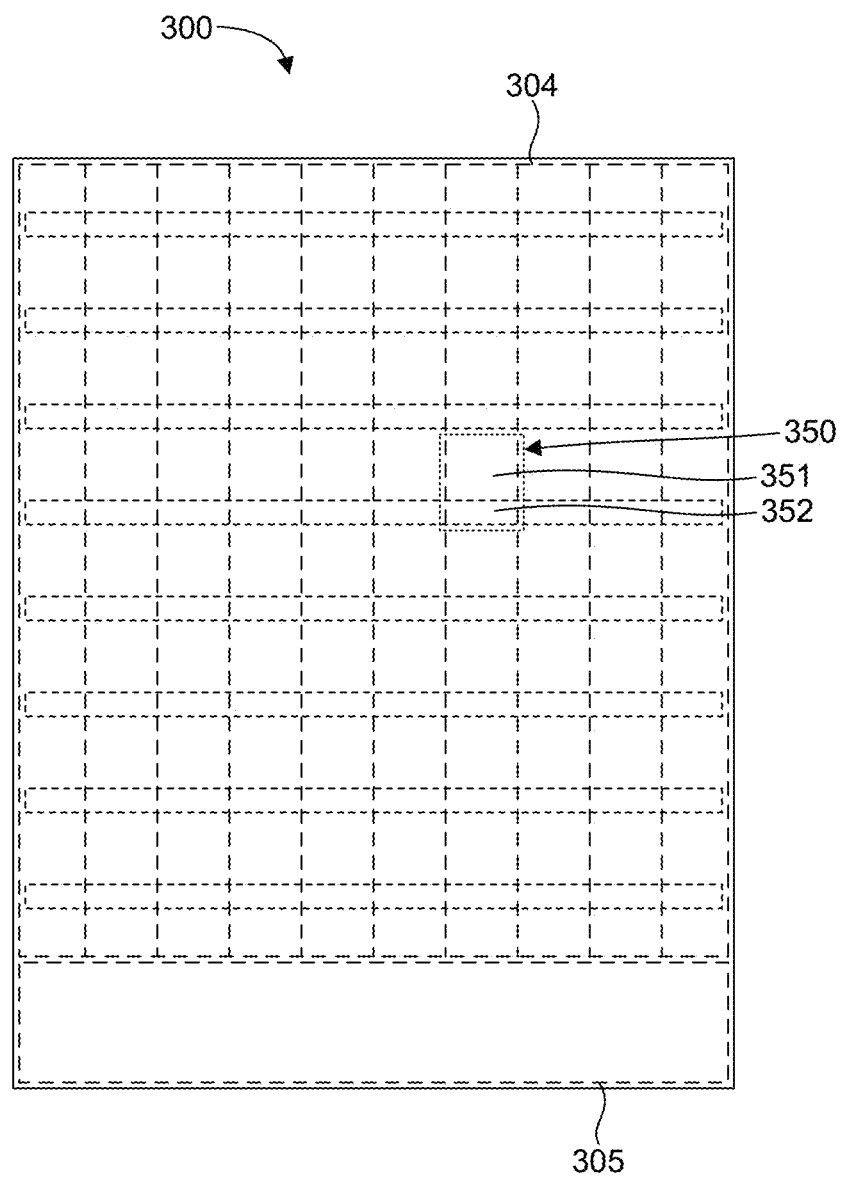
FIG. 5A illustrates a general layout of a solid state memory component in accordance with an example.

An example of a general layout or arrangement of a solid state memory component 300 is illustrated in FIG. 5A. This plan view shows a memory array region (i.e., a general or global memory array region indicated generally at 304) and a periphery (i.e., a global periphery portion or region indicated generally at 305). The general memory array region 304 is subdivided or segmented into blocks of memory arrays, with each block having a local or block memory array and a staircase. A staircase facilitates electrical connections to word lines connected to memory cells in a local or block memory array. For example, a typical memory block 350 includes a local or block memory array portion or region 351 and a staircase portion or region 352.

Figure 5B:
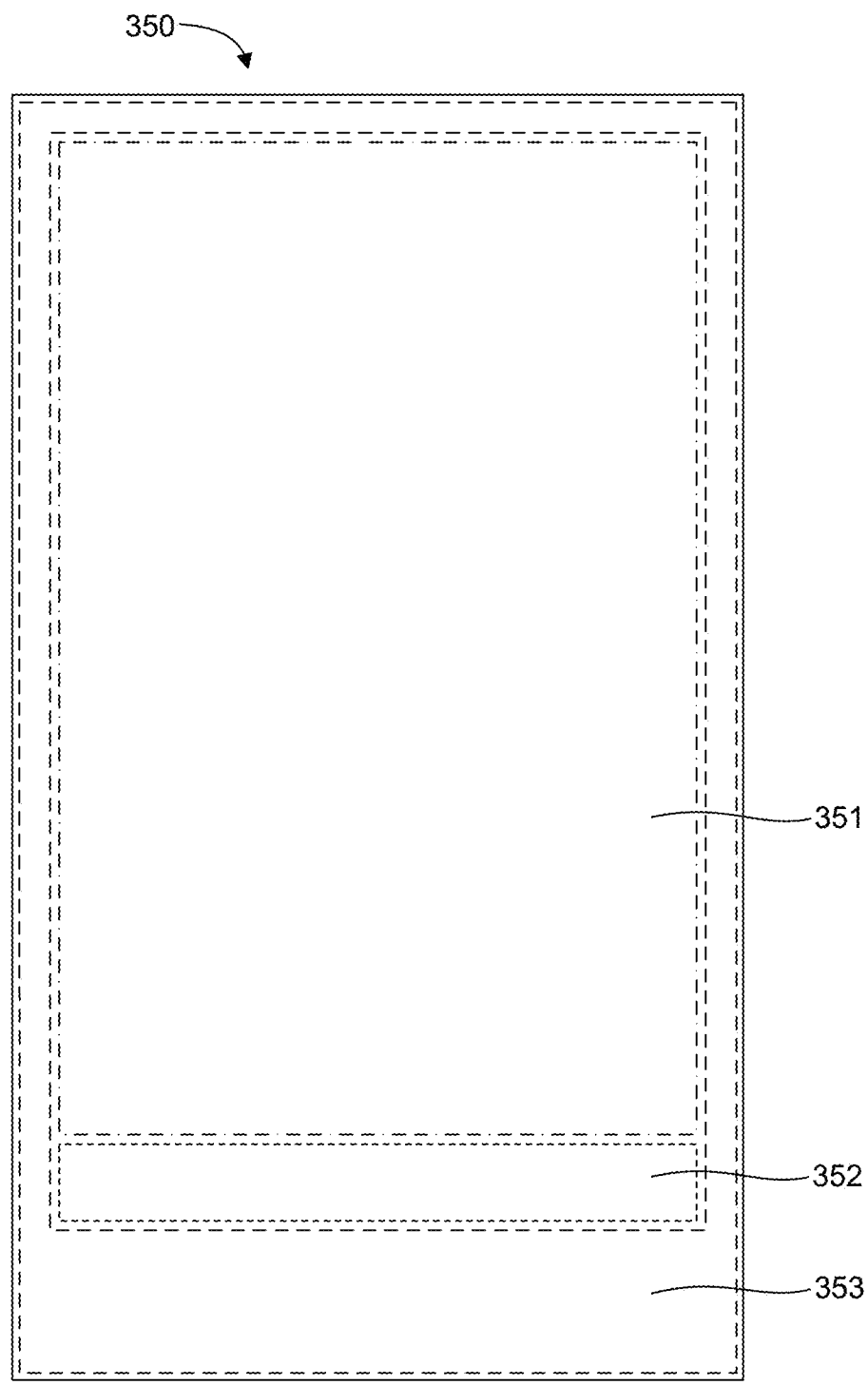
FIG. 5B illustrates a general layout of a memory block of the solid state memory component of FIG. 5A.

The general layout or arrangement of the memory block 350 is shown in FIG. 5B. This figure shows the memory array portion 351 and the staircase portion 352 in more detail. In addition, FIG. 5B shows a local or block periphery portion 353 about the memory array portion 351 and the staircase portion 352. The local or block periphery portion 353 between memory blocks may provide room for CMOS connections and routing. Typically, memory pillars and memory cell features are not located in this area. For example, functional memory pillars (i.e., pillars connected to a bit line and a source line) are typically located in a memory array portion with no functional or non-functional memory features in a periphery portion of the memory component. In one aspect, the technology of the present disclosure provides for the formation and presence of memory pillars and associated memory cell structures not only inside the local or block memory array portion 351, but outside as well, such as in the local or block periphery portion 353 and/or in the global periphery portion or region 305. Locating memory structures (i.e., memory pillars) in a periphery portion can provide benefits for manufacturing solid state memory components. For example, the presence of non-functional memory features in a periphery portion of a memory component can improve topography uniformity, alignment tolerance, and unit process uniformity and capability. Accordingly, memory structures (i.e., memory pillars) in a periphery portion can be numerous and widespread throughout a periphery portion sufficient to achieve the manufacturing benefits discussed herein. Thus, relatively few or isolated memory structures in a periphery portion may be inadequate to provide manufacturing benefits. As such, manufacturing benefits can be achieved by including enough memory structures to occupy a sufficient area of a periphery portion when viewed in a plan or top view. In one aspect, an area of a periphery portion (e.g., the local or block periphery portion 353 or the general memory array region 304) occupied by memory structures (i.e., memory pillars) can be greater than 25%. In another aspect, an area of a periphery portion (e.g., the local or block periphery portion 353 or the general memory array region 304) occupied by memory structures (i.e., memory pillars) can be greater than 50%. In yet another aspect, an area of a periphery portion (e.g., the local or block periphery portion 353 or the general memory array region 304) occupied by memory structures (i.e., memory pillars) can be greater than 75%. With any of these minimum periphery percentage values, it should be recognized that a maximum area occupied by memory structures may not exceed a practical limitation dictated by the geometry of the memory structures. For example, multiple memory structures having circular areas in a plan view cannot occupy 100% of a rectangular or other polygonal area, as there will be some unoccupied spaces between adjacent memory structures. Because the benefits of non-functional memory features are realized during manufacture, these features can optionally be removed prior to the formation of the final product.

In a final product and/or at a suitable stage of manufacture, functional memory pillars can be located in the local or block memory array portion 351 of the computer memory component 300, and non-functional memory pillars (i.e., electrically isolated or not electrically connected to a bit line and/or a source line) can be located in a periphery portion (e.g., the local or block periphery portion 353 and/or in the global periphery portion or region 305) of the computer memory component 300. In some embodiments, non-functional memory pillars can even be located in the local or block memory array portion 351 of the computer memory component 300, as desired, for example to fill in a space devoid of memory features within the memory array portion 351. In one aspect, functional memory pillars and non-functional memory pillars can be uniformly distributed across the computer memory component 300, including the memory array portions and periphery portions.

Memory pillars and memory cells can be formed by any suitable method. For example, a pillar opening can be formed by etching through multiple alternating layers or tiers of conductive and dielectric materials. Conductive layers can include any suitable conductive material, such as polysilicon, which can be conductively doped (e.g., to an N+ type conductivity). Dielectric layers can include any suitable dielectric material, such as an oxide (e.g., silicon oxide), an oxynitride (e.g., silicon oxynitride), etc. In one aspect, a precursor to a solid state memory component can include pillar openings in a periphery portion, as well as in a memory array portion.

Following the formation of the pillar opening, with or without the formation of memory cells adjacent the pillar opening, the pillar opening can be filled with a suitable conductor or semiconductor material to form a pillar.

To form functional memory pillars, pillars with associated memory cells can be electrically coupled to bit lines (e.g., at location 117a or 117b in FIG. 1 or location 217a or 217b in FIG. 4) and source lines (e.g., location 119a or 119b in FIG. 1 or location 219a or 219b in FIG. 4). In general, such an electrical connection can be made by forming an opening in a dielectric layer (e.g., by etching) that is disposed on a given conductor and then disposing a conductive material in the opening, which can be subsequently electrically coupled to a desired component. For example, the pillar 110 of FIG. 1 can be electrically coupled to the bit line 116 by a conductive material disposed in openings through dielectric material on opposite sides of the select gate 111 at locations 117a and 117b. The pillar 110 of FIG. 1 can be electrically coupled to the source line 118 by a conductive material disposed in openings through dielectric material on opposite sides of the select gate 112 at locations 119a and 119b. Similarly, the pillar 210 of FIG. 4 can be electrically coupled to the bit line 216 by a conductive material disposed in openings through dielectric material on opposite sides of the select gate 211 at locations 217a and 217b. The pillar 210 of FIG. 4 can be electrically coupled to the source line 218 by a conductive material disposed in openings through dielectric material on opposite sides of the select gate 212 at locations 219a and 219b. The conductive material can be any suitable material, such as polysilicon, which can be conductively doped (e.g., to an N+ type conductivity).

To form non-functional pillars, pillars with or without associated memory cells are electrically isolated from the bit lines (e.g., at location 117a or 117b in FIG. 1 or location 217a or 217b in FIG. 4) and/or the source lines (e.g., location 119a or 119b in FIG. 1 or location 219a or 219b in FIG. 4). In general, a pillar can be electrically isolated from a bit line and/or a source line by maintaining a dielectric layer between the pillar and the bit line and/or the source line. For example, the pillar 110 of FIG. 1 can be electrically isolated from the bit line 116 by maintaining dielectric material (i.e., without an opening for a conductor) on at least one of the opposite sides of the select gate 111 at locations 117a and 117b. The pillar 110 of FIG. 1 can be electrically isolated from the source line 118 by maintaining dielectric material (i.e., without an opening for a conductor) on at least one of the opposite sides of the select gate 112 at locations 119a and 119b. Similarly, the pillar 210 of FIG. 4 can be electrically isolated from the bit line 216 by maintaining dielectric material (i.e., without an opening for a conductor) on at least one of the opposite sides of the select gate 211 at locations 217a and 217b. The pillar 210 of FIG. 4 can be electrically isolated from the source line 218 by maintaining dielectric material (i.e., without an opening for a conductor) on at least one of the opposite sides of the select gate 212 at locations 219a and 219b.

If memory cells are to be formed adjacent to a pillar (e.g., a functional or non-functional pillar), a series of processes, including etching and deposition processes, can be executed using the pillar opening for access to memory cell locations. Memory cell structures that can be formed include charge storage structures (e.g., floating gates), control gates, tunnel dielectrics, blocking dielectrics, etc. Many of the processes utilized to form memory cells can cause the layers or tiers of conductive and dielectric materials to expand or grow, which is referred to as "tier expansion."

Figure 6:
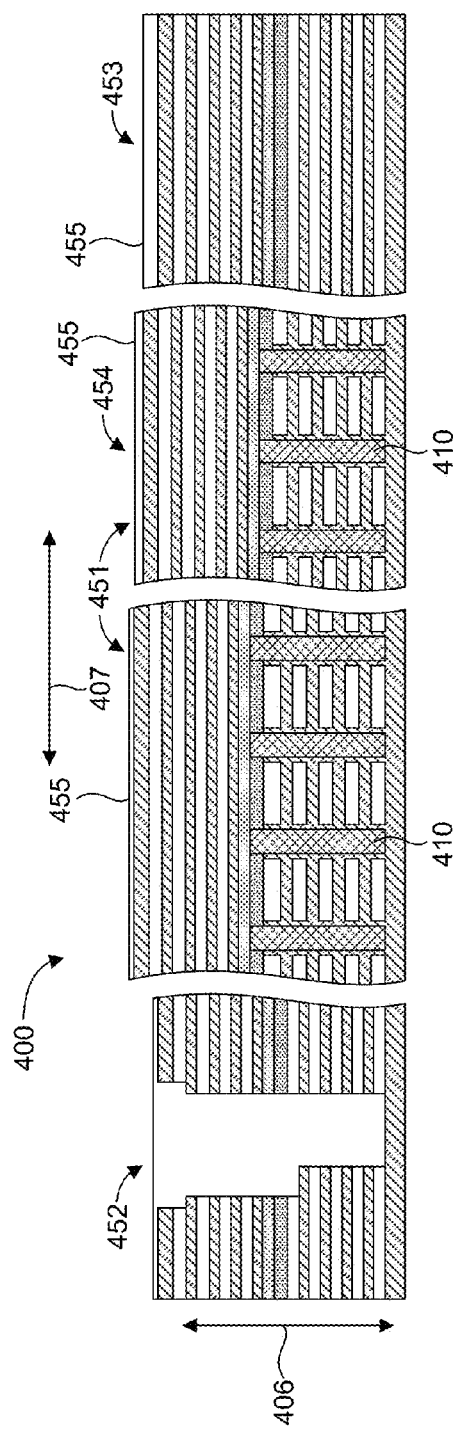
FIG. 6 illustrates a cross-sectional view of a typical solid state memory component.

Such expansion is illustrated in FIG. 6, which shows a cross-sectional view of a typical solid state memory component 400. As shown in the figure, the computer memory component 400 includes a memory array portion 451, a staircase portion 452, and a periphery portion 453. The memory array portion 451 includes functional memory pillars 410. No memory pillars are located in the periphery portion 453. An edge region of the memory array portion 451 proximate the periphery portion 453 is indicated at 454. FIG. 6 illustrates the differential expansion in a vertical direction 406 of the various regions or portions of the computer memory component 400 following the formation of pillar openings due to tier expansion.

With no pillars in the staircase region 452 or the periphery portion 453, these areas experience relatively little expansion in the vertical direction 406 compared to the memory array portion 451. The result of this differential vertical expansion is a surface topography that can result in non-uniformity or uneven layer thicknesses, as exemplified by the variations in thickness of the topmost layer(s) 455 (e.g., more oxide and poly residuals remaining in the periphery 453 and at the edge 454 of the memory array than in the rest of the array). It should be noted that in FIG. 6, alternating layers of conductive and dielectric materials on top of the memory pillars 410 exist for the formation of a second "deck" of memory pillars, which may be electrically coupled to the lower or first deck of memory pillars 410. Thus, the differential vertical expansion of the memory array portion 451 and the periphery portion 453 can negatively affect numerous processes in the manufacture of a finished computer memory component.

Transitions between high and low density pillar pattern regions can be problematic for certain processes (e.g., result in increased topography). As mentioned above, functional memory pillars and non-functional memory pillars can be uniformly distributed across a computer memory component, including the memory array portions and periphery portions. Such uniform distribution can minimize or eliminate transitions between high and low density pillar pattern regions, thus minimizing or eliminating problems that may arise in certain processes. It should be recognized that pillars can be uniformly distributed and still have small regions (e.g., between a memory array portion and a periphery portion) without pillars due to manufacturing needs.

In addition to vertical expansion 406, the various regions or portions of the computer memory component 400 can also experience expansion in a horizontal direction 407 following the formation of pillar openings due to tier expansion. This aspect of tier expansion is discussed in more detail below.

Figure 7:
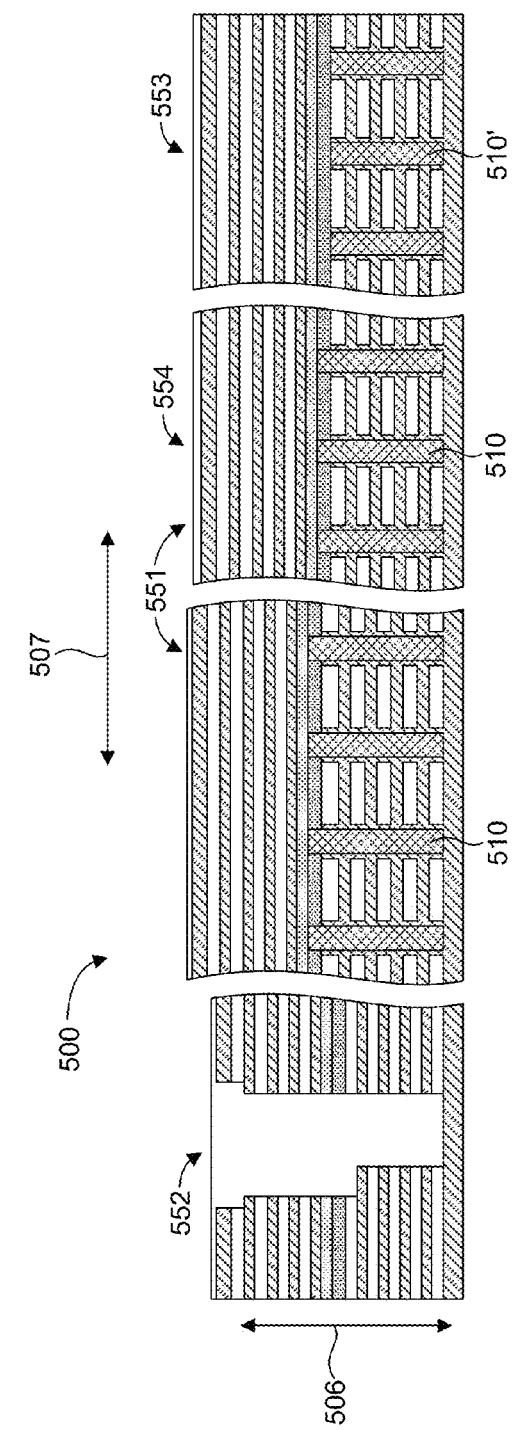
FIG. 7 illustrates a cross-sectional view of a solid state memory component in accordance with an example.

In contrast to the tier expansion of a typical solid state memory component in FIG. 6, FIG. 7 illustrates the tier expansion of a computer memory component 500 in accordance with an example of the present disclosure. As with the typical memory component 400 of FIG. 6, the memory component 500 of FIG. 7 includes a memory array portion 551, a staircase portion 552, and a periphery portion 553. The memory array portion 551 includes functional memory pillars 510. An edge region of the memory array portion 551 proximate the periphery portion 553 is indicated at 554. In this case, the computer memory component 500 includes memory cells (i.e., non-functional memory cells 510') in the periphery portion 553. The result is a reduction in differential expansion in a vertical direction 506 (i.e., reduced topography) between the memory array portion 551 and the periphery portion 553 due to the presence of memory pillars in both areas, which causes these regions with pillars to expand in a similar manner.

Figure 8A:
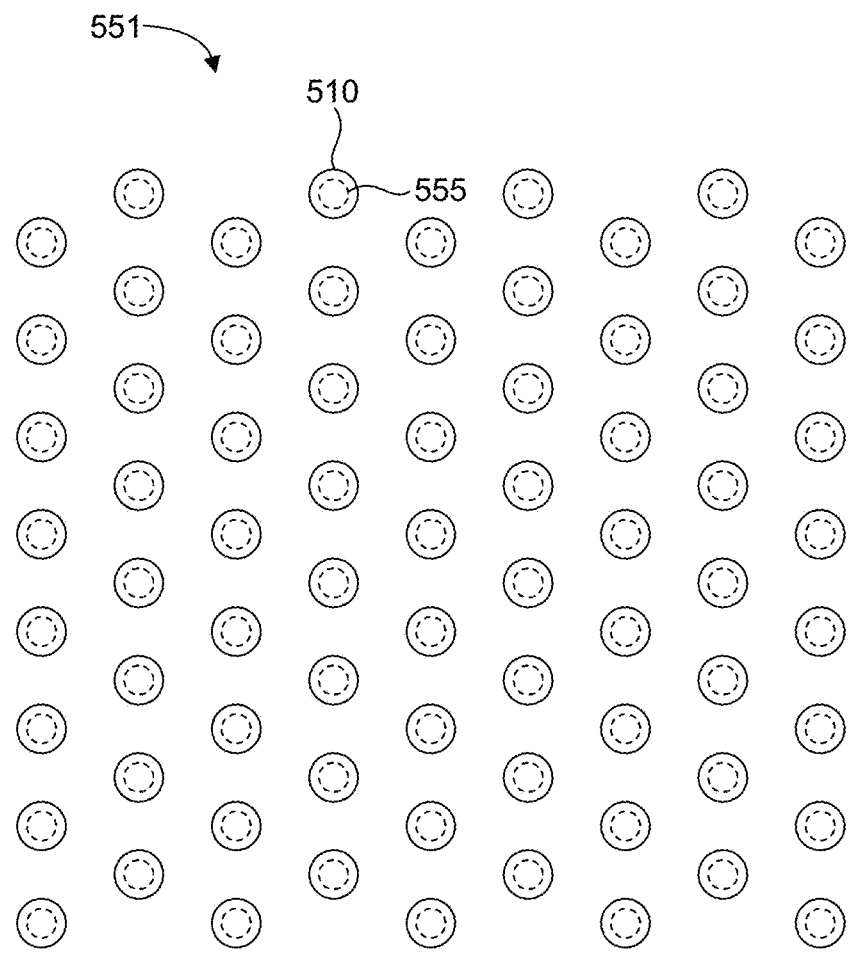
FIG. 8A illustrates a top view of a memory array portion of a solid state memory component following pillar formation in accordance with an example.
Figure 8B:
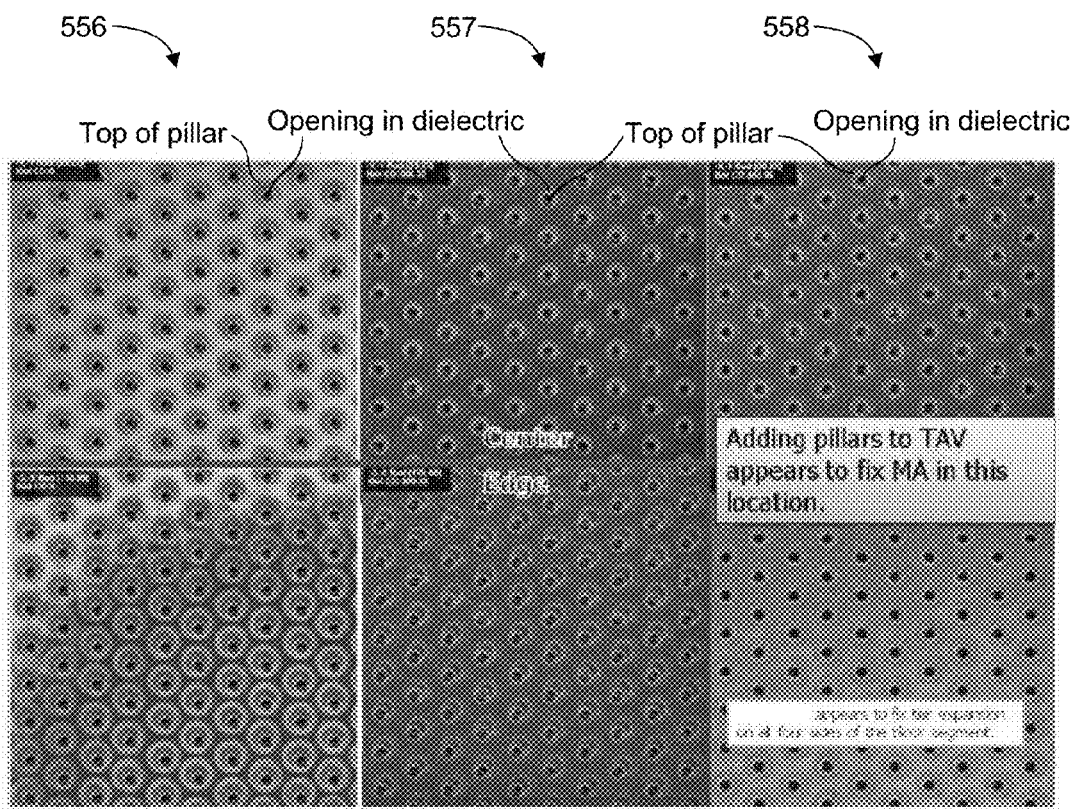
FIG. 8B is an image comparing memory array portions of solid state memory components following pillar formation.

The effect of tier expansion in a horizontal direction 507 is addressed with reference to FIG. 8A. Tier expansion has an effect on pillars that causes them to be misaligned for subsequent processes. FIG. 8A shows a top view of the memory array portion 551 following formation of the pillars 510. At this stage, for the formation of functional memory pillars, openings 555 are formed in a dielectric layer that is over the tops of the pillars 510. These openings are typically formed by etching, which utilizes a mask to locate the openings. In a typical memory component configuration with no memory structures (i.e., pillars) in a periphery portion, tier expansion causes the pillars to move horizontally such that misalignment occurs between the tops of the pillars and the mask opening locations. Increased oxide layer thickness at an edge of the memory array due to topography created by vertical expansion can also make photo alignment of openings difficult. The result is horizontal misalignment between the pillars and the openings formed in the dielectric, which becomes more pronounced as distance increases from the center of a memory component (e.g., a memory block) or a wafer, for example, in an edge region of a memory array or wafer. This is illustrated in the image of FIG. 8B, indicated generally at 556 and 557. Subsequent to formation of the openings in the dielectric layer, conductive material is disposed in the openings to form electrical connections with bit lines. Due to horizontal misalignment, these connections may suffer or lack integrity. Horizontal misalignment due to tier expansion therefore has a negative effect on the electrical connections between the pillars and the bit lines. In contrast to the configuration of a typical memory component, a memory component configuration in accordance with the present disclosure, which includes memory structures (i.e., pillars) in a periphery portion, can minimize horizontal misalignment due to tier expansion. As illustrated in FIG. 8A, the pillars 510 and the openings 555 in the dielectric are aligned. FIG. 8B also illustrates this generally at 558. This is due to the presence of memory pillars in the memory array portion and the periphery portion, which causes the areas to expand in a similar (i.e., uniform) manner, thus minimizing expansion differences between center and outer regions of a memory component or wafer.

Forming memory pillars (i.e., memory pillar openings) in memory array portions and periphery portions can benefit any process subsequent to formation of the pillars (or pillar openings), such as any dry or wet (e.g., chemical mechanical planarization (CMP)) process that may be used in the manufacture of a solid state memory component. Thus, non-uniformity and misalignment can be minimized during manufacture of a solid state memory component by forming memory pillars (i.e., memory pillar openings) alone or in combination with associated memory cell features in a memory array portion and in a periphery portion of the solid state memory component.

Although the present disclosure is provided in the context of a NAND flash memory device, it should be recognized that certain aspects of the present disclosure may also be applicable to NOR flash memory devices.

Figure 9:
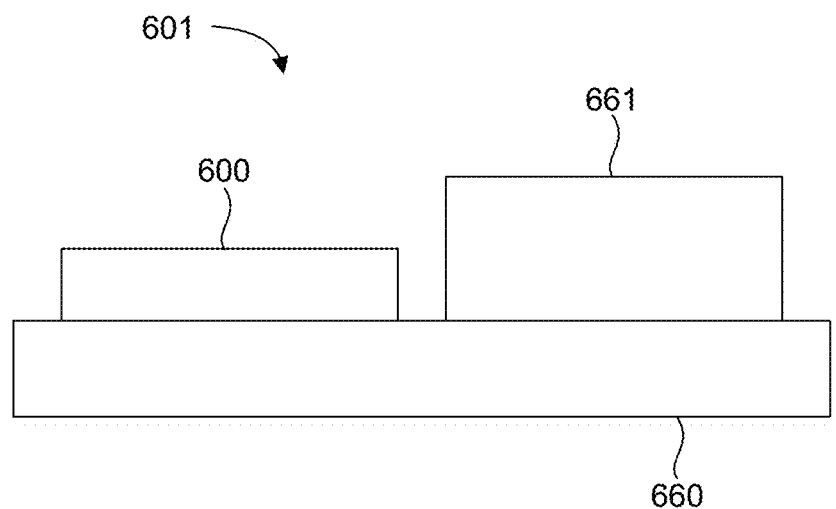
FIG. 9 is a schematic illustration of an exemplary memory device.

FIG. 9 is a schematic representation of a memory device 601 in accordance with an example of the present disclosure. The memory device can include a substrate 660 and a solid state memory component 600 as disclosed herein operably coupled to the substrate 660. In one aspect, the memory device 601 can include any suitable electronic component 661, such as a CPU, a GPU, a memory controller, a video decoder, an audio decoder, a video encoder, a camera processor, system memory, and/or a modem.

Figure 10:
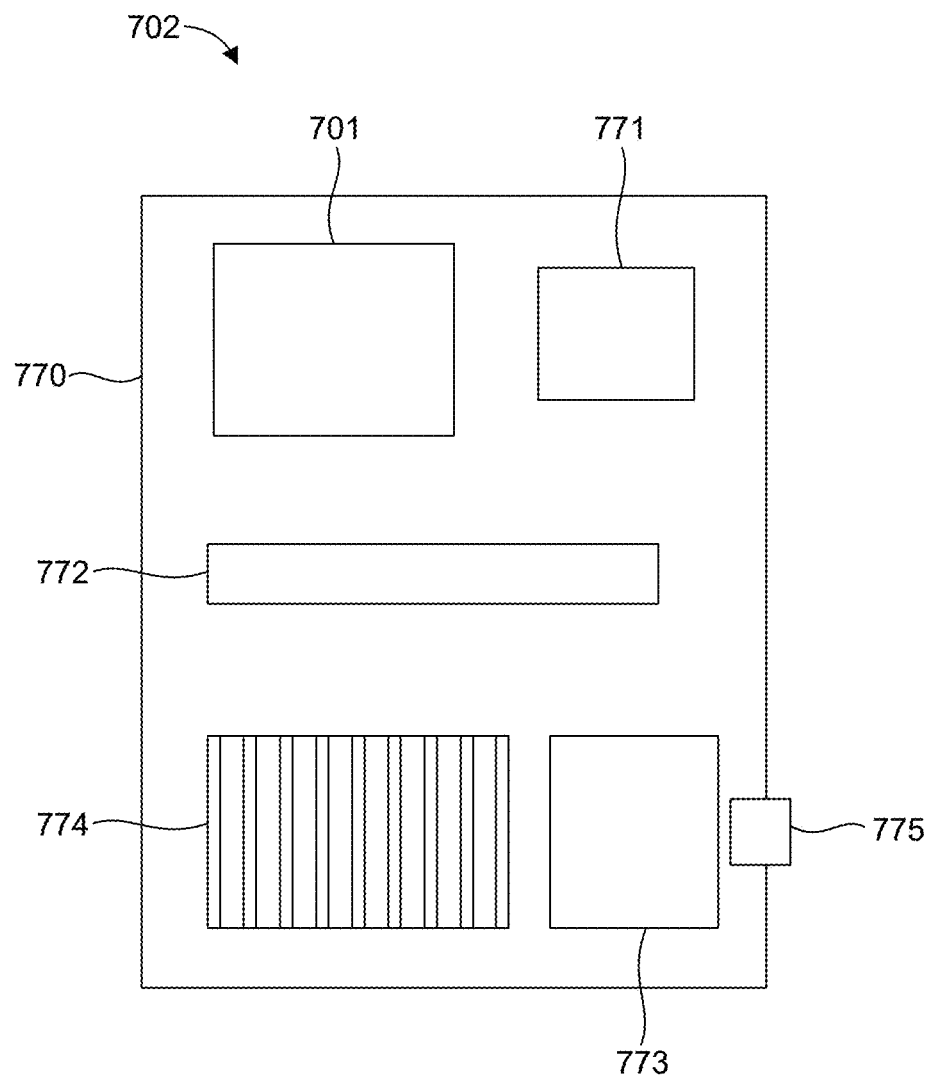
FIG. 10 is a schematic illustration of an exemplary computing system.

FIG. 10 illustrates an example computing system 702. The computing system 702 can include a memory device 701 as disclosed herein, coupled to a motherboard 770. In one aspect, the computing system 702 can also include a processor 771, a memory device 772, a radio 773, a heat sink 774, a port 775, a slot, or any other suitable device or component, which can be operably coupled to the motherboard 770. The computing system 702 can comprise any type of computing system, such as a desktop computer, a laptop computer, a tablet computer, a smartphone, a wearable device, a server, etc. Other embodiments need not include all of the features specified in FIG. 10, and may include alternative features not specified in FIG. 10.

Circuitry used in electronic components or devices (e.g. a die) of an memory device can include hardware, firmware, program code, executable code, computer instructions, and/or software. Electronic components and devices can include a non-transitory computer readable storage medium which can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

EXAMPLES

The following examples pertain to further embodiments.

In one example there is provided, a solid state memory component comprising a plurality of bit lines, a source line, and a plurality of non-functional memory pillars, each non-functional memory pillar being electrically isolated from one or both of the plurality of bit lines and the source line.

In one example, a solid state memory component comprises a plurality of functional memory pillars, each functional memory pillar being electrically coupled to one of the plurality of bit lines and one of the source line.

In one example of a solid state memory component, the plurality of functional memory pillars and the plurality of non-functional memory pillars are uniformly distributed across the solid state memory component.

In one example of a solid state memory component, the plurality of functional memory pillars is located in a memory array portion of the memory component, and the plurality of non-functional memory pillars is located in a periphery portion of the solid state memory component.

In one example of a solid state memory component, the plurality of functional memory pillars and the plurality of non-functional memory pillars are vertically oriented.

In one example of a solid state memory component, memory cells are adjacent to each of the functional memory pillars and the non-functional memory pillars.

In one example of a solid state memory component, each memory cell comprises a charge storage structure.

In one example of a solid state memory component, the charge storage structure is a floating gate.

In one example of a solid state memory component, each memory cell comprises a control gate.

In one example of a solid state memory component, each memory cell comprises a tunnel dielectric adjacent to the functional or non-functional memory pillar, a charge storage structure adjacent to the tunnel dielectric, a blocking dielectric adjacent to the charge-storage structure, and a control gate adjacent to the blocking dielectric.

In one example of a solid state memory component, strings of the memory cells adjacent to the functional memory pillars are coupled in series.

In one example of a solid state memory component, at least some of the plurality of non-functional memory pillars are located in a periphery portion of the solid state memory component.

In one example of a solid state memory component, memory cells are adjacent to each of the non-functional memory pillars.

In one example there is provided, a solid state memory component comprising a plurality of pillars located in a periphery portion of the solid state memory component, and memory cells adjacent to each of the pillars.

In one example of a solid state memory component, each memory cell comprises a charge storage structure.

In one example of a solid state memory component, the charge storage structure is a floating gate.

In one example of a solid state memory component, each memory cell comprises a control gate.

In one example of a solid state memory component, each memory cell comprises a tunnel dielectric adjacent to the pillar, a charge storage structure adjacent to the tunnel dielectric, a blocking dielectric adjacent to the charge-storage structure, and a control gate adjacent to the blocking dielectric.

In one example of a solid state memory component, some of the plurality of pillars are located in a memory array portion of the solid state memory component.

In one example of a solid state memory component, the plurality of pillars is uniformly distributed across the solid state memory component.

In one example of a solid state memory component, at least some of the pillars located in the memory array portion are electrically coupled to a bit line and a source line, and each of the pillars located in the periphery portion is electrically isolated from at least one of the bit line and the source line.

In one example there is provided a memory device comprising a substrate, a solid state memory component operably coupled to the substrate, the solid state memory component having a plurality of bit lines, a source line, and a plurality of non-functional memory pillars, each non-functional memory pillar being electrically isolated from one or both of the plurality of bit lines and the source line.

In one example, a memory device comprises a plurality of functional memory pillars, each functional memory pillar being electrically coupled to one of the plurality of bit lines and one of the source line.

In one example of a memory device, the plurality of functional memory pillars and the plurality of non-functional memory pillars are uniformly distributed across the solid state memory component.

In one example of a memory device, the plurality of functional memory pillars is located in a memory array portion of the solid state memory component, and the plurality of non-functional memory pillars is located in a periphery portion of the solid state memory component.

In one example of a memory device, the plurality of functional memory pillars and the plurality of non-functional memory pillars are vertically oriented.

In one example of a memory device, memory cells are adjacent to each of the functional memory pillars and the non-functional memory pillars.

In one example of a memory device, each memory cell comprises a charge storage structure.

In one example of a memory device, the charge storage structure is a floating gate.

In one example of a memory device, each memory cell comprises a control gate.

In one example of a memory device, each memory cell comprises a tunnel dielectric adjacent to the functional or non-functional memory pillar, a charge storage structure adjacent to the tunnel dielectric, a blocking dielectric adjacent to the charge-storage structure, and a control gate adjacent to the blocking dielectric.

In one example of a memory device, strings of the memory cells adjacent to the functional memory pillars are coupled in series.

In one example, a memory device comprises a CPU, a GPU, a memory controller, a video decoder, an audio decoder, a video encoder, a camera processor, system memory, a modem, or a combination thereof.

In one example there is provided a memory device comprising a substrate, a solid state memory component operably coupled to the substrate, the solid state memory component having a plurality of pillars located in a periphery portion of the solid state memory component, and memory cells adjacent to each of the pillars.

In one example of a memory device, each memory cell comprises a charge storage structure.

In one example of a memory device, the charge storage structure is a floating gate.

In one example of a memory device, each memory cell comprises a control gate.

In one example of a memory device, each memory cell comprises a tunnel dielectric adjacent to the pillar, a charge storage structure adjacent to the tunnel dielectric, a blocking dielectric adjacent to the charge-storage structure, and a control gate adjacent to the blocking dielectric.

In one example of a memory device, some of the plurality of pillars are located in a memory array portion of the solid state memory component.

In one example of a memory device, the plurality of pillars is uniformly distributed across the solid state memory component.

In one example of a memory device, at least some of the pillars located in the memory array portion are electrically coupled to a bit line and a source line, and each of the pillars located in the periphery portion is electrically isolated from at least one of the bit line and the source line.

In one example, there is provided a computing system comprising a motherboard, and a memory device operably coupled to the motherboard. The memory device comprises a substrate, a solid state memory component operably coupled to the substrate, the solid state memory component having a plurality of bit lines, a source line, and a plurality of non-functional memory pillars, each non-functional memory pillar being electrically isolated from one or both of the plurality of bit lines and the source line.

In one example, there is provided a computing system comprising a motherboard, and a memory device operably coupled to the motherboard. The memory device comprises a substrate, a solid state memory component operably coupled to the substrate, the solid state memory component having a plurality of pillars located in a periphery portion of the solid state memory component, and memory cells adjacent to each of the pillars.

In one example of a computing system, the computing system comprises a desktop computer, a laptop, a tablet, a smartphone, a wearable device, a server, or a combination thereof.

In one example of a computing system, the computing system further comprises a processor, a memory device, a heat sink, a radio, a slot, a port, or a combination thereof operably coupled to the motherboard.

In one example there is provided a method for making a solid state memory component comprising forming a plurality of memory pillars, forming memory cells adjacent to each of the memory pillars, and electrically coupling only a portion of the plurality of memory pillars to bit lines and a source line, such that a remaining portion of the plurality of memory pillars are electrically isolated from one or both of the bit lines and the source line.

In one example of a method for making a solid state memory component, the portion of the plurality of memory pillars electrically isolated from one or both of the bit lines and the source line are located in a periphery portion of the solid state memory component.

In one example of a method for making a solid state memory component, the portion of the plurality of memory pillars electrically coupled to the bit lines and the source line are located in a memory array portion of the solid state memory component.

In one example of a method for making a solid state memory component, the plurality of memory pillars is uniformly distributed across the solid state memory component.

In one example of a method for making a solid state memory component, forming memory cells comprises forming charge storage structures.

In one example of a method for making a solid state memory component, the charge storage structures are floating gates.

In one example of a method for making a solid state memory component, forming memory cells comprises forming control gates.

In one example of a method for making a solid state memory component, forming memory cells comprises forming tunnel dielectrics adjacent to the memory pillars, forming charge storage structures adjacent to the tunnel dielectrics, forming blocking dielectrics adjacent to the charge storage structures, and forming control gates adjacent to the blocking dielectrics.

In one example there is provided a method for minimizing misalignment during manufacture of a solid state memory component comprising forming a plurality of memory pillars in a memory array portion of the solid state memory component, and forming a plurality of memory pillars in a periphery portion of the solid state memory component.

In one example of a method for making a solid state memory component, the plurality of memory pillars is uniformly distributed across the solid state memory component.

In one example, a method for making a solid state memory component comprises forming memory cells adjacent to each of the memory pillars.

In one example of a method for making a solid state memory component, forming memory cells comprises forming charge storage structures.

In one example of a method for making a solid state memory component, the charge storage structures are floating gates.

In one example of a method for making a solid state memory component, forming memory cells comprises forming control gates.

In one example of a method for making a solid state memory component, forming memory cells comprises forming tunnel dielectrics adjacent to the memory pillars, forming charge storage structures adjacent to the tunnel dielectrics, forming blocking dielectrics adjacent to the charge storage structures, and forming control gates adjacent to the blocking dielectrics.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:
1. A solid state memory component, comprising:
a plurality of bit lines;
a source line;
a plurality of non-functional memory pillars, each non-functional memory pillar being electrically isolated from one or both of the plurality of bit lines and the source line;
a plurality of functional memory pillars, each functional memory pillar being electrically coupled to one of the plurality of bit lines and one of the source lines;

wherein memory cells are adjacent to each of the functional memory pillars and the non-functional memory pillars;

wherein each memory cell comprises:
- a tunnel dielectric adjacent to the functional or non-functional memory pillar;
- a charge storage structure adjacent to the tunnel dielectric;
- a blocking dielectric adjacent to the charge-storage structure; and
- a control gate adjacent to the blocking dielectric; and wherein the plurality of functional memory pillars is located in a memory array portion of the memory component and at least some of the plurality of non-functional memory pillars are located in a periphery portion of the solid state memory component.

2. The solid state memory component of claim 1, wherein the plurality of functional memory pillars and the plurality of non-functional memory pillars are vertically oriented.

3. The solid state memory component of claim 1, wherein strings of the memory cells adjacent to the functional memory pillars are coupled in series.

4. The solid state memory component of claim 3, wherein the memory structures have a channel length that is the same regardless of location in the string of memory cells.

5. The solid state memory component of claim 3, wherein the memory structures have a channel length that is different from another channel length of another memory cell in the string.

6. A memory device, comprising:
a substrate;
a solid state memory component as recited in claim 1, operably coupled to the substrate.

7. The memory device of claim 6, wherein the plurality of functional memory pillars and the plurality of non-functional memory pillars are uniformly distributed across the solid state memory component.

8. The memory device of claim 6, wherein the plurality of functional memory pillars and the plurality of non-functional memory pillars are vertically oriented.

9. The memory device of claim 6, wherein the charge storage structure is a floating gate.

10. The memory device of claim 6, wherein strings of the memory cells adjacent to the functional memory pillars are coupled in series.

11. The memory device of claim 10, wherein the memory structures have a channel length that is the same regardless of location in the string of memory cells.

12. The memory device of claim 10, wherein the memory structures have a channel length that is different from another channel length of another memory cell in the string.

13. The memory device of claim 6, further comprising a CPU, a GPU, a memory controller, a video decoder, an audio decoder, a video encoder, a camera processor, system memory, a modem, or a combination thereof.

14. The memory device of claim 6, wherein the charge storage structure is a dielectric charge trap.

15. The solid state memory component of claim 1, wherein the charge storage structure is a floating gate.

16. The solid state memory component of claim 1, wherein the charge storage structure is a dielectric charge trap.

* * * * *